Figure 1:
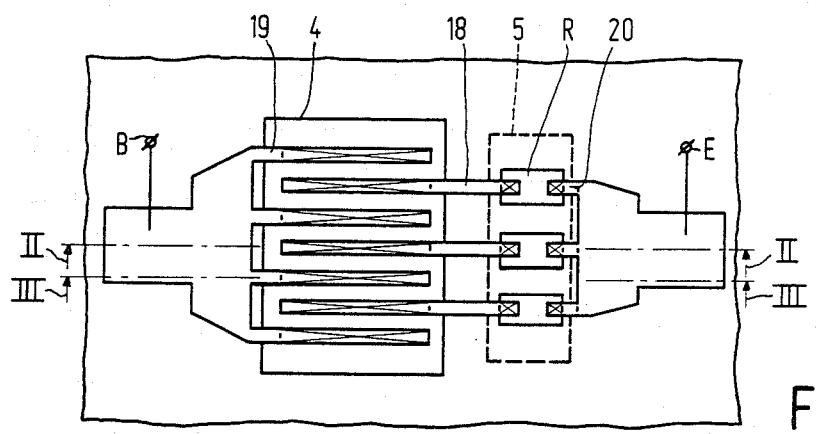

United States Patent [19]

Moors

[11] Patent Number: 4,762,804
[45] Date of Patent: Aug. 9, 1988

[54] METHOD OF MANUFACTURING A BIPOLAR TRANSISTOR HAVING EMITTER SERIES RESISTORS

[75] Inventor: Petrus M. A. W. Moors, Nijmegen, Netherlands

[73] Assignee: U.S. Philips Corporation, New York, N.Y.

[21] Appl. No.: 8,111

[22] Filed: Jan. 23, 1987

Related U.S. Application Data

[63] Continuation of Ser. No. 778,650, Sep. 23, 1985, abandoned.

[30] Foreign Application Priority Data

Oct. 12, 1984 [NL] Netherlands ............ 8403111

[51] Int. Cl.$^4$ .................................. H01L 21/265
[52] U.S. Cl. ............................... 437/31; 437/60; 437/918; 357/34
[58] Field of Search ............ 397/34, 35, 51; 29/578, 29/576 B, 590, 577 C, 576 C; 148/187; 437/31, 32, 33, 60, 918

[56] References Cited

U.S. PATENT DOCUMENTS

| | | | |
|---|---|---|---|
| 4,233,615 | 11/1980 | Takemato et al. | 357/51 |
| 4,240,096 | 12/1980 | Hiraki et al. | 357/51 |
| 4,253,107 | 2/1981 | Macdougall | 357/51 |
| 4,309,626 | 1/1982 | Kudo | 357/51 |
| 4,418,469 | 12/1983 | Fujita | 29/578 |
| 4,443,812 | 4/1984 | Imaizumi et al. | 357/51 |
| 4,456,488 | 6/1984 | Gahle | 357/34 |
| 4,566,176 | 1/1986 | Moors et al. | 29/578 |
| 4,654,687 | 3/1987 | Hebert | 148/DIG. 11 |

OTHER PUBLICATIONS

Ghandhi, S. K. "VLSI Fabrication Principals" 1983, pp. 354-357, 626-631.

*Primary Examiner*—Brian E. Hearn
*Assistant Examiner*—Kevin McAndrews
*Attorney, Agent, or Firm*—Paul R. Miller

[57] ABSTRACT

A method is set forth of manufacturing a bipolar transistor with emitter ballast resistors. According to the invention, a base window and a strip-shaped opening are formed beside each other on a collector region. The strip-shaped opening is first covered by a masking layer and then doping of the base is provided. After removal of the masking layer, oxide layers of the same thickness are formed in the base window and in the strip-shaped opening. After formation of emitter fingers, base contact windows are formed within the base zone, and resistance windows are formed within the strip-shaped opening, whereupon simultaneously base contact zones and mutually separated emitter ballast resistors are formed in these windows.

3 Claims, 1 Drawing Sheet

U.S. Patent   Aug. 9, 1988   4,762,804

METHOD OF MANUFACTURING A BIPOLAR TRANSISTOR HAVING EMITTER SERIES RESISTORS

This application is a continuation of parent application, Ser. No. 778,650 filed on Sept. 23, 1985, now abandoned, and all benefits for such earlier application are hereby claimed for this continuation.

The invention relates to a method of manufacturing a semiconductor device comprising a bipolar transistor, in which there is formed in a collector region of a first conductivity type at least one base zone of the second oppposite conductivity type, in which base zone a number of emitter zones of the first conductivity type are provided, while beside the base zone emitter series resistors of the second conductivity type are formed, which are connected to at least one emitter electrode and to a connection conductor leading to an emitter connection.

The invention further relates to a semi-conductor device manufactured by the use of the method.

A method of the kind described above is known from U.S. Pat. No. 3,896,475 of the Applicant.

In the case of power transistors that have to be operated at high voltage, the presence of emitter series resistors for avoiding so-called "second breakdown" is necessary, the phenomenon of second breakdown occurs when due to a non-uniform current distribution over the emitter zones("current crowding") the temperature locally increases, as a result of which an avalanche effect is produced which leads to local current concentration and finally to destruction of the transistor.

In order to avoid this, the emitter zones are provided with emitter series resistors, also designated as ballast or stabilization resistors. These resistors ensure that a uniform distribution of the current over the various emitter zones is obtained due to the fact that upon increase of the current across an emitter zone the voltage drop across the series resistor connected thereto increases, as a result of which the current through this emitter zone decreases.

Various methods are known by which these emitter series resistors can be realized. The aforementioned U.S. Pat. No. 3,896,475 discloses a frequently used method, according to which a common strip-shaped semiconductor resistance region of the same conductivity type as the base zone is used, which forms a pn junction with the collector region. The series resistor associated with a given emitter zone is then formed by the material of the resistance region present between the connection with the relevant emitter electrode and the connection with the connection conductor.

This construction has the disadvantage of a large collector-emitter capacitance because of the comparatively large surface area of the common resistance region. This is especially unfavourable in high-frequency transistors, more particularly transmitter transistors. A further disadvantage of this known construction is that parallel resistors are present between adjacent emitter electrodes so that the effective value of the resulting emitter series resistors is not accurately determined.

The parallel resistors can be avoided in that separate semiconductor resistors of the opposite conductivity type are provided in the semiconductor resistance region, for example, by means of the emitter doping. The disadvantage of the large collector-emitter capacitance is maintained also in this construction, however.

Other known solutions for avoiding the aforementioned disadvantages, in which separate emitter series resistors are used, have the disadvantage of more or less complicated additional processing steps.

The invention has inter alia for its object to provide a simple method, in which the disadvantages are avoided and in which no additional doping steps and no critical additional masking and alignment steps are required.

According to the invention, a method of the kind described in the opening paragraph is characterized in that a base window and a strip-shaped opening are formed beside each other in an insulating layer disposed on the collector region, in that the strip-shaped opening is covered by a masking layer, in that the base doping is introduced via the base window, in that, after the masking layer has been removed, oxide layers of substantially the same thickness are formed within the base window and within the strip-shaped opening, in that emitter windows are formed in the oxide layer within the base zone, in that the emitter zones are formed by doping through the emitter windows, in that then a number of mutually separated resistance windows are etched into the oxide layer within the stripshaped opening and a number of base contact windows are etched within the base zone while using an etching mask, in that base contact zones and mutually separated emitter series resistors of the second conductivity type are formed by doping through these windows with the etching mask masking against this doping, and in that then the emitter electrodes, the base electrodes, the connection conductors and the remaining parts of the metallization are provided.

By the use of the method according to the invention, the collector-emitter capacitance is considerably reduced, while no parasitic parallel resistors are formed either between the now separated emitter series resistors.

Moreover, these advantages are obtained in a very simple manner and without additional doping steps, i.e. by covering the strip-shaped opening at the correct instant with a non-critical mask, while the windows are all etched into an oxide layer of the same thickness. As a result, there is no risk of under-etching.

The invention is of particular importance in those cases in which the base, base contact and emitter dopings are effected by means of ion implantation. Use can then be made of a photoresist as a masking layer. During the step of etching the base contact windows and the resistance windows, the photoresist is then not removed, but is used to mask the already implanted emitter zones against the base contact and the emitter series resistance implantation.

The invention will now be described more fully with reference to an embodiment and the drawing, in which:

FIG. 1 shows diagrammatically in plan view a semiconductor device manufactured by the use of the method according to the invention, FIGS. 2A–D show diagrammatically in cross-section taken on the line II—II of FIG. 1 successive stages of the method, and FIGS. 3A–D show diagrammatically in cross-section taken on the line III—III of FIG. 1 successive stages of the method.

The Figures are purely schematic and are not drawn to scale. For the sake of clarity, in particular the dimensions in the direction of thickness are comparatively strongly exaggerated. In the cross-sections, semiconductor regions of the same conductivity type are cross-hatched in the same direction.

Figures 2, 3:
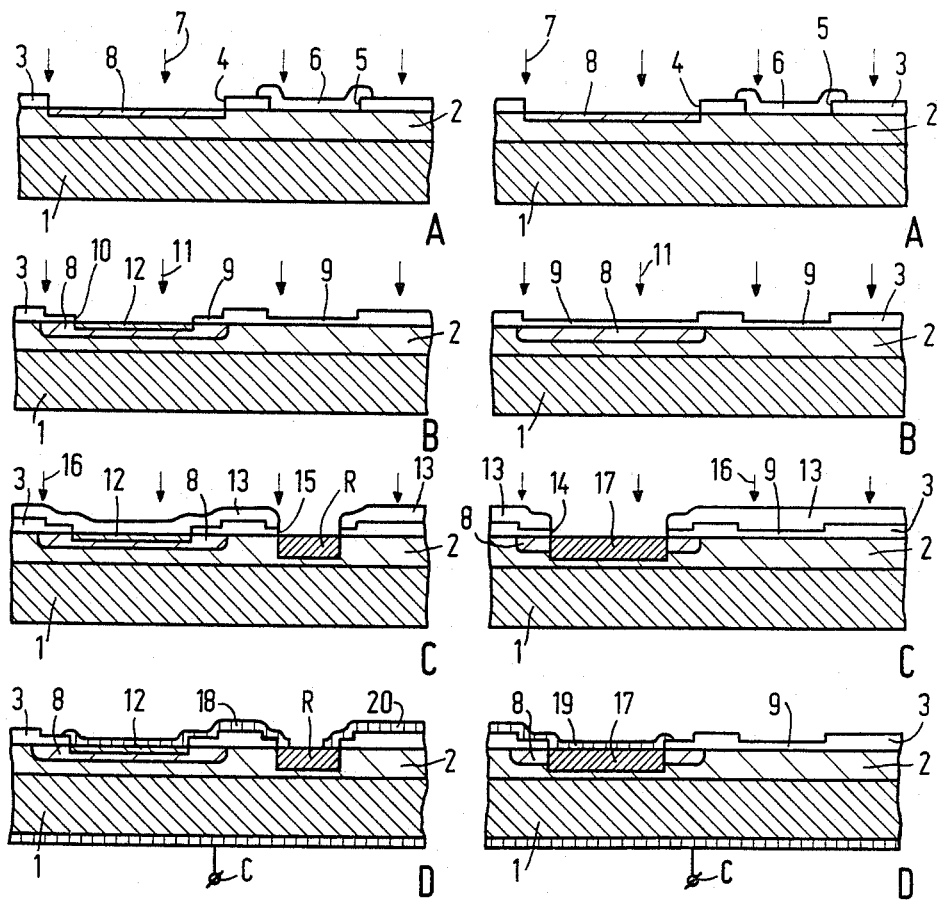

FIG. 1 shows in plan view a semiconductor device manufactured by the use of the method according to the invention. FIGS. 2D and 3D show diagrammatically cross-sections of the semiconductor device taken on the lines II—II and III—III, respectively, while FIGS. 2A-C and 3A-C show the device during successive stages of manufacture.

The semiconductor device comprises a bipolar transistor having a collector region (1,2) of a first conductivity type, in this example the n-conductivity type, a base zone 8 of the second opposite (in this case p-)conductivity type and in this zones a number of emitter zone 12 of the first (n-) conductivity type. Beside the base zone there are present p-type emitter series resistors R, which are each connected to an emitter electrode 18 and to a connection conductor 20 leading to an emitter connection E. Furthermore, the base zone is provided with highly doped p-type contact zones 17, which are contacted by base electrodes 19, which themselves are connected to a base connction B. Although other geometries are also possible, the emitter zones 12 and the base contact zones 17 in this example take the form of strip-shaped regions, while the base and emitter electrodes are interdigitated in a usual manner. Contact windows are indicated in FIG. 1 by diagonal lines.

The semiconductor device can be manufactured according to the invention in the following manner.

Starting material (cf. FIGS. 2A.3A) is a semiconductor wafer, in this example of n-type silicon, consisting of an epitaxial n-type silicon layer 2 having a thickness of 7 $\mu$m and a resistivity of about 1 $\Omega$cm, which is grown on a substrate 1 of highly doped n-type silicon having a resistivity of, for example, 0.01$\Omega$.cm. Other thicknesses and/or dopings are possible and will be chosen by those skilled in the art in accordance with the existing conditions. The collector region is constituted by the regions 1 and 2.

On the collector region there is formed on the layer 2 an insulating layer 3. This layer is in this embodiment a silicon oxide layer having a thickness of, for example, 0.8 $\mu$m and which is formed, for example, by thermal oxidation.

Subsequently, a base window 4 and a strip-shaped opening 5 are formed beside each other in the oxide layer 3 by photolithographic etching: of. FIGS. 2A, 3A. In FIG. 1, the circumference of the opening 5 is indicated by a dotted line; in the finished product, this line does not indicate the boundary of a semiconductor zone, but it marks the area of a step in the oxide thickness.

The opening 5 is now covered with a masking layer 6, in this embodiment a photoresist layer, which is shaped into the form of the desired mask by known exposure and development techniques. Photoresist layers are also to be understood to mean herein layers which are sensitive to radiations other than visible radiation, for example ultraviolet, X-ray or electron radiation. This mask is not critical.

By means of an implantation of boron ions 7 (dose 7.10$^{13}$ ions/cm$^2$, energy 25 keV), base doping 8 is now provided via the base window 4. The oxide layer 3 and the photoresist mask 6 mask against this implantation.

Subsequently, an oxide layer 9 having a thickness of about 0.4 $\mu$m is formed in the two openings 4 and 5 by pyrolytic deposition; cf. FIGS. 2B,3B. Emitter windows 10 are formed in this oxide layer 9 within the base window 4 (cf. FIG. 2B). The layer 9 may alternatively be formed by thermal oxidation. If the layer 9 is deposited pyrolytically, it is also formed on the oxide layer 3.

By means of implantation of arsenic ions 11 at a dose of 6.10$^{15}$ ions/cm$^2$ and an energy of 50 keV, the emitter zones 12 are now formed, the oxide layers 3 and 9 masking against this implantation.

Thereafter, a photoresist mask 13 is provided (cf. FIGS. 2C, 3C) having openings at the area of the base contact zones and resistors to be formed. While using the mask 13 as an etching mask, the base contact windows 14 are etched within the base zone 8 and a number of mutually separated resistance windows 15 are etched within the strip-shaped opening 5 into the oxide layer 9. By means of implantation of boron ions 16 at a dose of 10$^{15}$ ions/cm$^2$ and an energy of 40 keV, the base contact zones 17 and the mutually separated emitter series resistors R are then formed. During this ion implantation, the photoresist mask 13 remains present for masking the emitter zones 12 against this implantation. Subsequently, after the photoresist mask has been removed and contact holes have been formed by dip-etching, the metallization is vapour-deposited and etched into the form of emitter electrodes 18, base electrodes 19, connection conductors 20 and the remaining parts of the conductor pattern.

The mutually separated emitter ballast resistors obtained by means of this method form with the collector region pn junctions having an overall surface area which is considerably smaller than the surface area of the region 5 (FIG. 1) so that the collector-emitter capacitance is considerably smaller than in constructions in which the region 5 forms a common semiconductor resistance region. Moreover, no parasitic parallel resistors can be formed between the emitter electrodes because the resistors R are electrically separated from each other.

The embodiment of the method according to the invention described here is the most favourable embodiment because the masks 6 and 13 are photoresist masks which can be readily provided and removed and which can be used as an implantation and/or etching mask. If diffusion doping is used instead of ion implantation, the method according to the invention can also be carried out. However, in this case, other heat-resistant materials have to be used for the masks 6 and 13, which materials themselves are shaped again into the desired form by means of a photoresist mask. In addition, these materials have to be selectively etchable with respect to the insulating layer (3, 9).

Furthermore, various modifications of the embodiment described above of the method according to the invention are possible. For example, the conductivity types of the various semiconductor regions and zones may be replaced (all simultaneously) by the opposite conductivity types. The semiconductor material may be a material other than silicon, for example gallium arsenide or germanium. The material of the insulating layers 3 and 9 may be thermal oxide, pyrolytic oxide, silicon nitride or another suitable insulating material or may consist of combinations thereof. The transistor described may further form part of an integrated circuit.

What is claimed is:

1. A method of manufacturing a semiconductor device with a bipolar transistor, said method comprising the steps of
    (a) providing a surface adjacent collector region of a first conductivity type, (b) providing an insulating layer on said collector region, (c) forming in said insulating layer a base window and a rectangular opening adjacent to said base window, (d) covering said rectangular opening by a masking layer, (e) introducing a dopant determining the second, opposite conductivity type in said collector region through said base window to form a base zone, (f) removing said masking layer, (g) forming by thermal oxidation first and second oxide layers of substantially equal thickness in said base window and in said rectangular opening, respectively, (h) forming a plurality of emitter windows in said first oxide layer in said base window, (i) introducing a dopant determining said first conductivity type in said base zone through said plurality of emitter windows to form a plurality of emitter zones, (j) then simultaneously etching a plurality of mutually separated resistance windows in said second oxide layer in said rectangular opening and a plurality of base contact windows in said first oxide layer of said base window, using an etching mask, (k) forming a plurality of base contact zones and a plurality of emitter series resistors by introducing a dopant determining said second conductivity type through said etching mask into said base contact windows and said resistance windows, and (l) providing connection conductors between said plurality of resistors and an emitter connection, providing a plurality of emitter electrodes between said resistors and said emitter zones, and providing a plurality of base electrodes between said base regions and a base connection.

2. A method as claimed in claim 1, characterized in that the base doping, and base contact and the resistance doping as well as the emitter doping are all effected by ion implantation.

3. A method as claimed in claim 2, characterized in that the masking layer and the etching mask consist of photoresist.

* * * * *